United States Patent

Ishii et al.

(10) Patent No.: US 9,658,505 B2
(45) Date of Patent: May 23, 2017

(54) DISPLAY DEVICE

(71) Applicant: Japan Display Inc., Minato-ku (JP)

(72) Inventors: Tatsuya Ishii, Tokyo (JP); Tetsuya Iizuka, Tokyo (JP)

(73) Assignee: Japan Display Inc., Minato-ku (JP)

( * ) Notice: Subject to any disclaimer, the term of this patent is extended or adjusted under 35 U.S.C. 154(b) by 99 days.

(21) Appl. No.: 14/688,356

(22) Filed: Apr. 16, 2015

(65) Prior Publication Data

US 2015/0301378 A1   Oct. 22, 2015

(30) Foreign Application Priority Data

Apr. 17, 2014 (JP) ................. 2014-085383

(51) Int. Cl.
G02F 1/1362 (2006.01)
H01L 27/12 (2006.01)
H01L 29/786 (2006.01)

(52) U.S. Cl.
CPC ...... *G02F 1/136209* (2013.01); *H01L 27/124* (2013.01); *H01L 27/1222* (2013.01); *H01L 29/78621* (2013.01); *H01L 29/78633* (2013.01); *H01L 29/78645* (2013.01); *H01L 29/78675* (2013.01)

(58) Field of Classification Search
None
See application file for complete search history.

(56) References Cited

U.S. PATENT DOCUMENTS

| 7,583,329 | B2 | 9/2009 | Ishii | |
|---|---|---|---|---|
| 8,168,982 | B2 | 5/2012 | Ishii | |
| 2008/0017885 | A1 | 1/2008 | Ishii | |
| 2008/0186422 | A1* | 8/2008 | Ishii | G02F 1/136209 349/44 |
| 2009/0065783 | A1* | 3/2009 | Moriwaki | G02F 1/136209 257/72 |
| 2011/0101353 | A1* | 5/2011 | Park | H01L 29/78633 257/59 |
| 2011/0241004 | A1* | 10/2011 | Ishii | H01L 27/1222 257/59 |
| 2013/0207087 | A1* | 8/2013 | Kim | H01L 27/3225 257/40 |

FOREIGN PATENT DOCUMENTS

JP    4197016 B2   12/2008

\* cited by examiner

*Primary Examiner* — Ashok Patel
(74) *Attorney, Agent, or Firm* — Oblon, McClelland, Maier & Neustadt, L.L.P.

(57) ABSTRACT

A display device includes an insulating substrate, a semiconductor layer formed of polycrystalline silicon, including a first impurity area, a second impurity area, and a channel area, an insulating film which covers the semiconductor layer, a gate electrode formed on the insulating film and opposed to the channel area, a source line electrically connected to the first impurity area, an electrode electrically connected to the second impurity area, and a light-shielding film located between the insulating substrate and the semiconductor layer, disposed at a position displaced from a position opposed to the source line, and opposed to an area including a boundary between the channel area and the second impurity area.

10 Claims, 11 Drawing Sheets

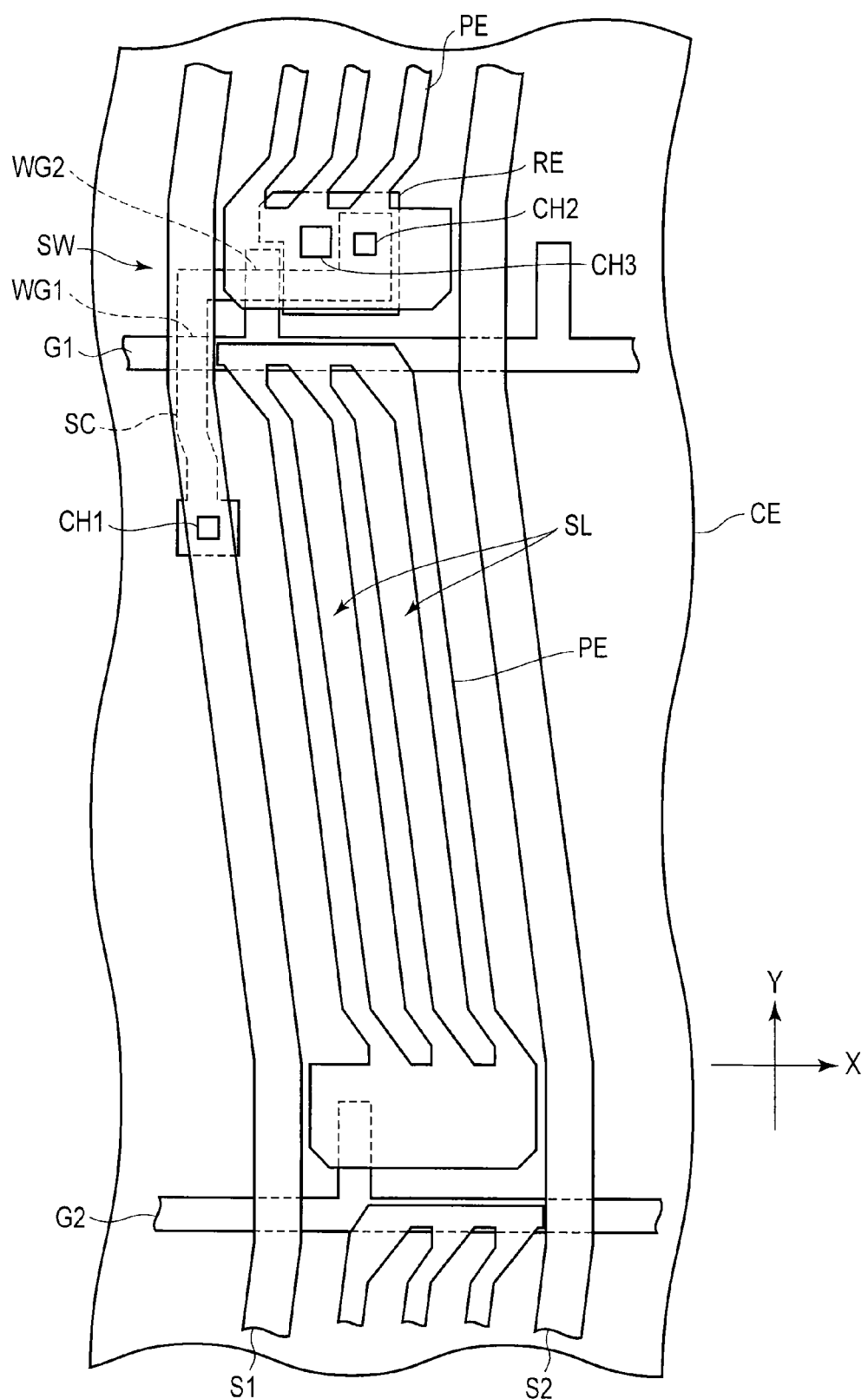
F I G. 2

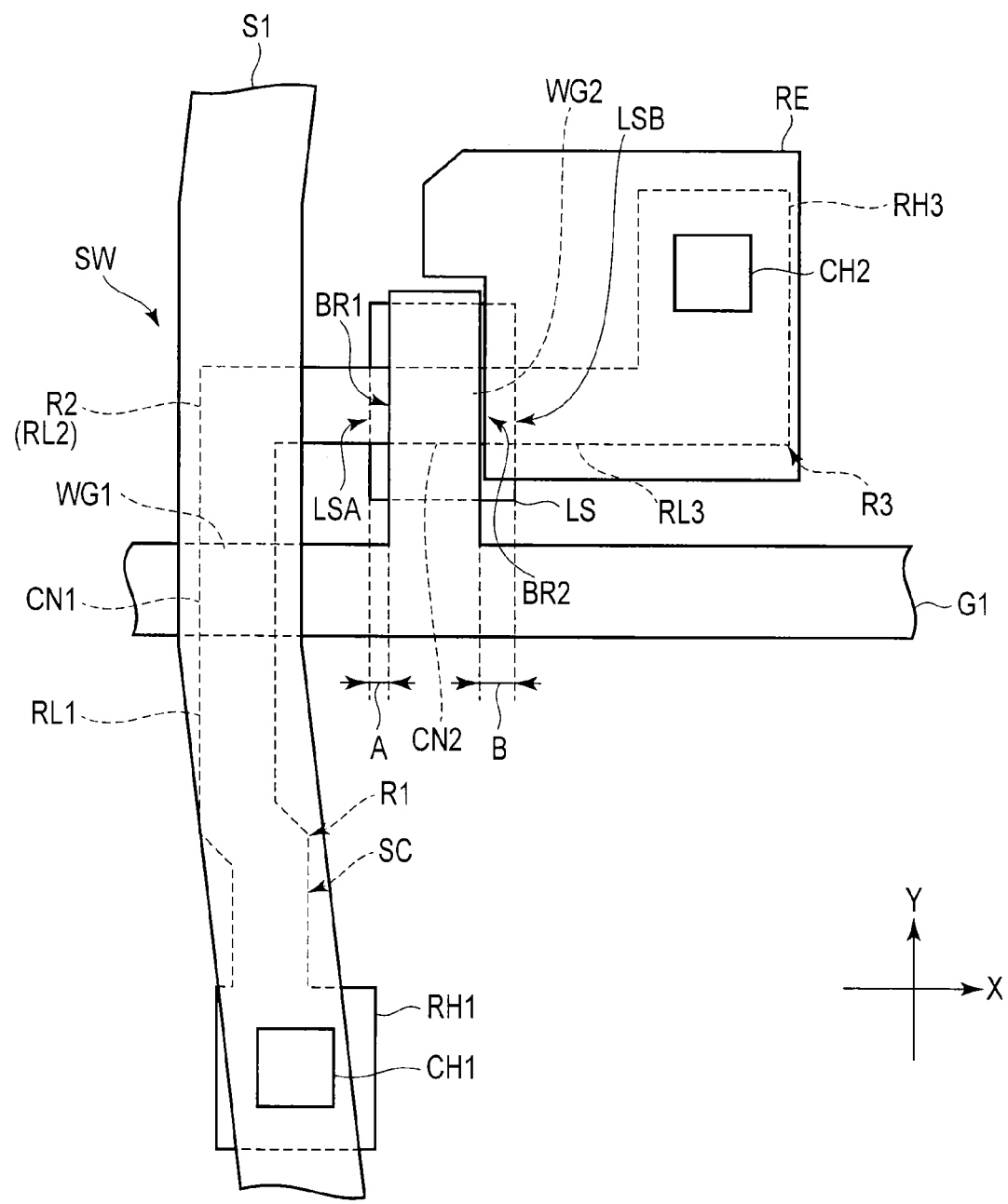
F I G. 8

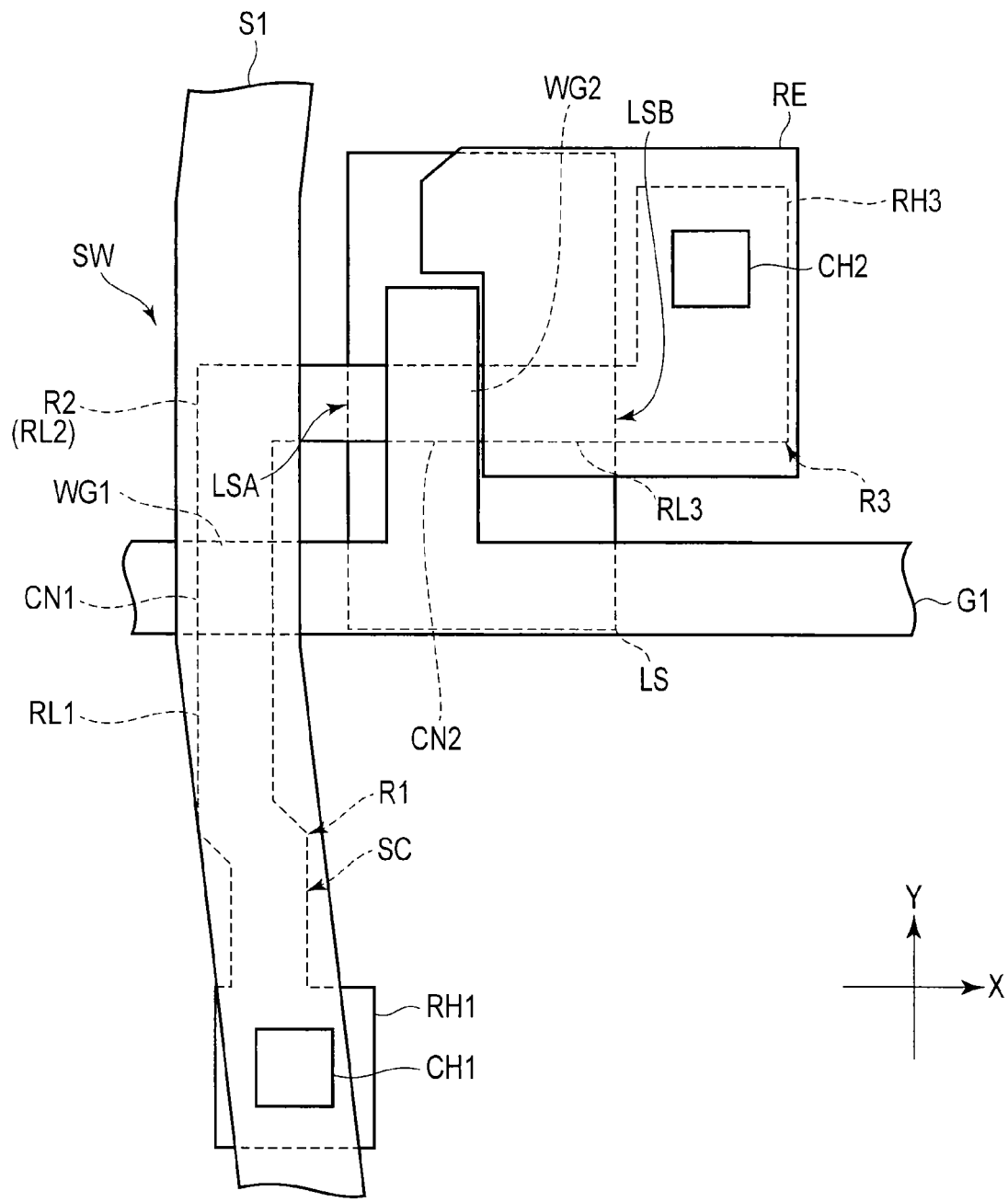
F I G. 9

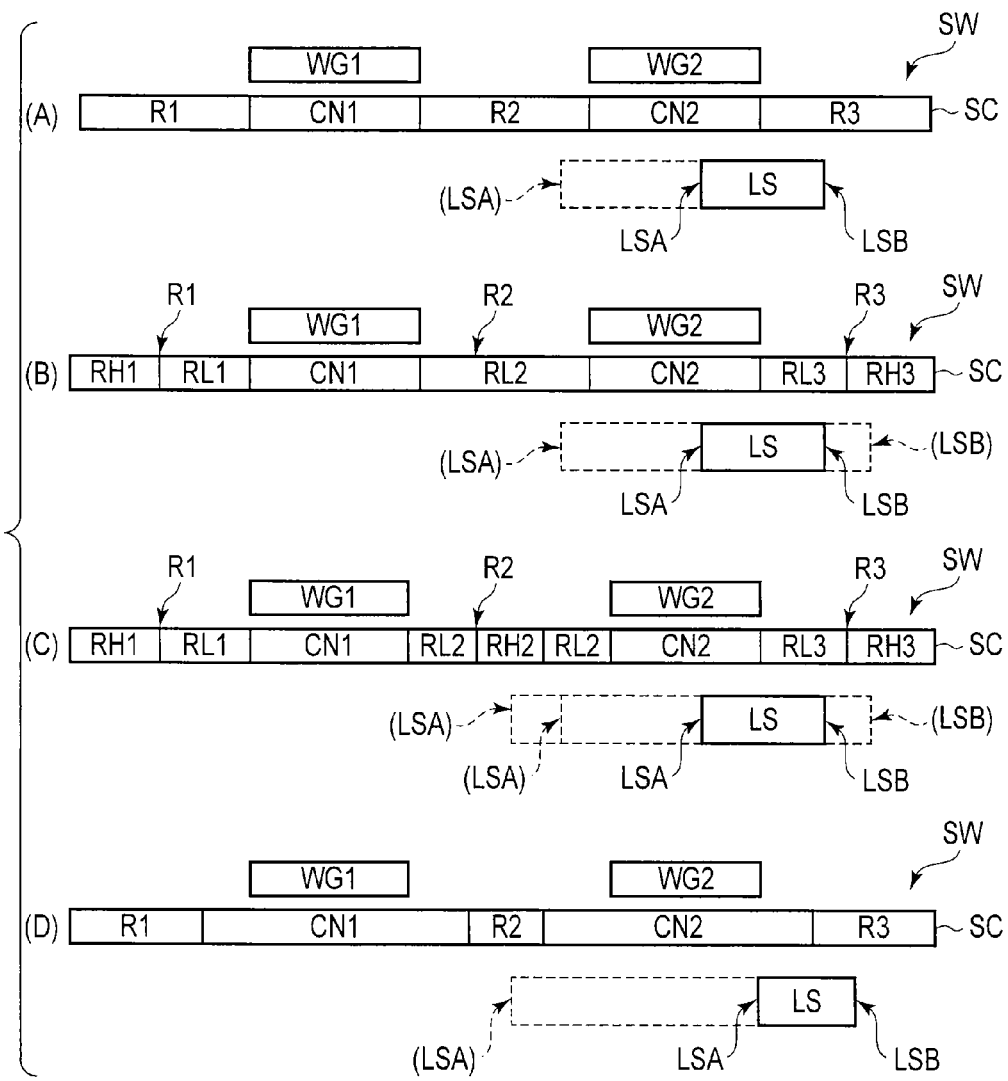
F I G. 10

DISPLAY DEVICE

CROSS-REFERENCE TO RELATED APPLICATIONS

This application is based upon and claims the benefit of priority from Japanese Patent Application No. 2014-085383, filed Apr. 17, 2014, the entire contents of which are incorporated herein by reference.

FIELD

Embodiments described herein relate generally to a display device.

BACKGROUND

Recently, a display device comprising a thin-film transistor has been put into practical use. Examples of the display device include a liquid crystal display device, an organic electroluminescence (EL) display device, etc. In such a thin-film transistor, a leakage current is produced by a semiconductor layer irradiated with light and an operation error may be thereby caused. For this reason, technology of providing a light-shielding film for shielding the semiconductor layer from the light has been proposed. A parasitic capacitance is produced between the light-shielding film and the semiconductor layer. As the area of the light-shielding film opposed to the semiconductor layer is larger, the parasitic capacitance becomes greater. In general, a comparatively great parasitic capacitance is produced since the light-shielding film is opposed to a substantially entire body of the semiconductor layer.

It should be noted that, in the thin-film transistor disposed in the vicinity of an intersection portion of a gate line and a source line, the potential of the semiconductor layer on a side electrically connected to the source line is varied in accordance with a video signal supplied to the source line, in a layout in which at least a part of the semiconductor layer overlaps the source line. For this reason, the potential of the light-shielding film which is capacitively coupled to the semiconductor layer is varied in accordance with the video signal. In addition, the light-shielding film is also opposed to the semiconductor layer on a side electrically connected to the pixel electrode. For this reason, the pixel potential written and held in the pixel electrode becomes unstable because of potential variation of the light-shielding film. Thus, in each of pixels electrically connected to the same source line, the held pixel potential may be disturbed in accordance with the video signal supplied to the source line and the display quality may be deteriorated.

BRIEF DESCRIPTION OF THE DRAWINGS

FIG. 2 is a plan view schematically showing a basic structure of each of pixels PX on an array substrate AR shown in FIG. 1.

FIG. 8 is a plan view schematically showing another structural example of the switching element SW applicable to the liquid crystal display device of the embodiments.

FIG. 9 is a plan view schematically showing another structural example of the switching element SW applicable to the liquid crystal display device of the embodiments.

FIG. 10 is a cross-sectional view schematically showing a positional relationship between the light-shielding film LS and the semiconductor layer SC in the switching element SW of the double-gate structure.

DETAILED DESCRIPTION

Figure 1:
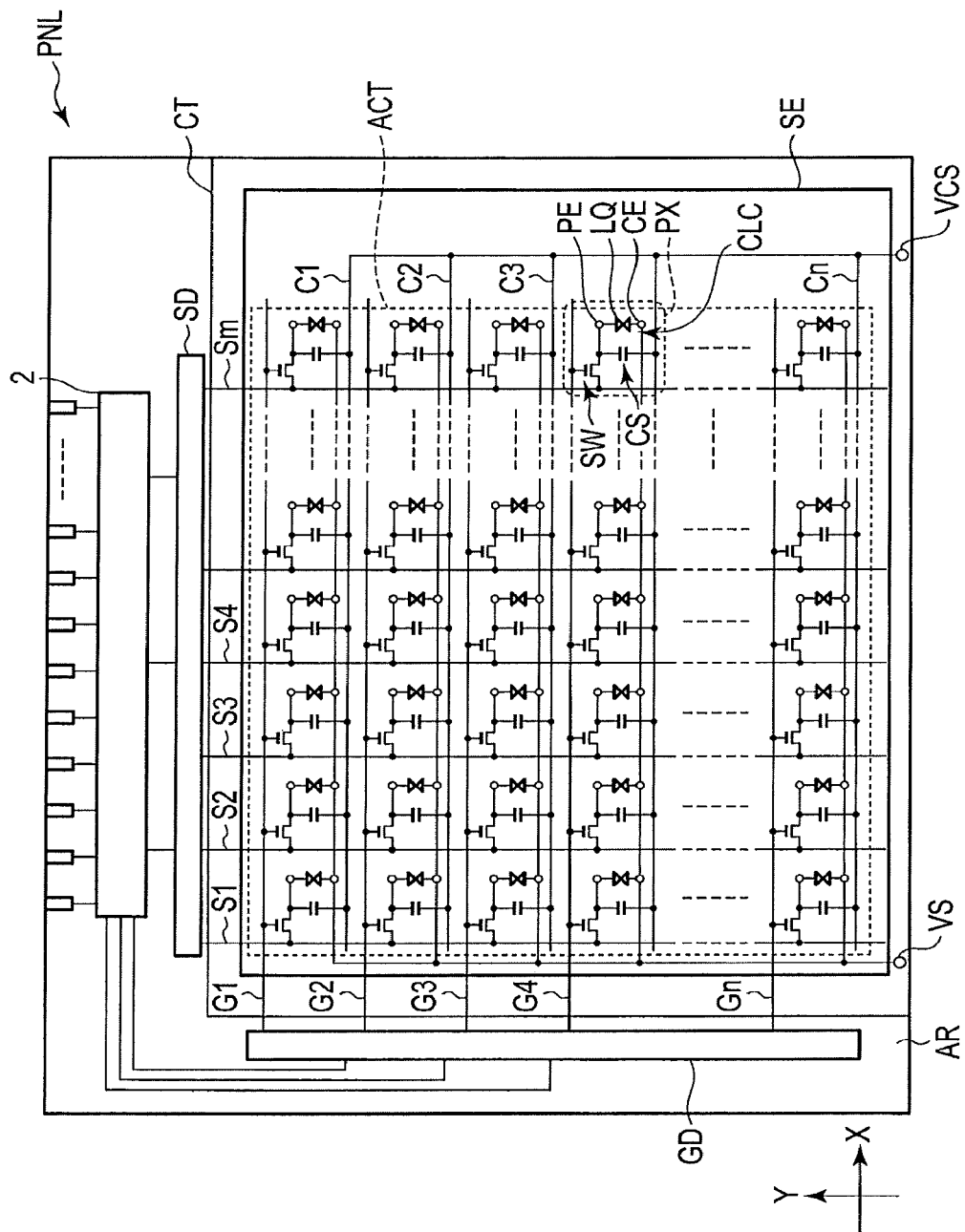
FIG. 1 is a diagram schematically showing a structure and an equivalent circuit, of a display panel PNL which constitutes a display device of the embodiments.

In general, according to one embodiment, a display device includes: an insulating substrate; a semiconductor layer formed of polycrystalline silicon, including a first impurity area, a second impurity area, and a channel area located between the first impurity area and the second impurity area; an insulating film which covers the semiconductor layer; a gate electrode formed on the insulating film and opposed to the channel area; a source line electrically connected to the first impurity area; an electrode electrically connected to the second impurity area; and a light-shielding film located between the insulating substrate and the semiconductor layer, disposed at a position displaced from a position opposed to the source line, and opposed to an area including a boundary between the channel area and the second impurity area.

According to another embodiment, a display device includes: an insulating substrate; a semiconductor layer formed of polycrystalline silicon, including a first impurity area, a second impurity area, a third impurity area, a first channel area located between the first impurity area and the second impurity area, and a second channel area located between the second impurity area and the third impurity area; an insulating film which covers the semiconductor layer; a first gate electrode formed on the insulating film and opposed to the first channel area; a second gate electrode formed on the insulating film, electrically connected to the first gate electrode, and opposed to the second channel area; a source line electrically connected to the first impurity area; an electrode electrically connected to the third impurity area; and a light-shielding film located between the insulating substrate and the semiconductor layer, disposed at a position displaced from a position opposed to the source line, and opposed to an area including a boundary between the second channel area and the third impurity area.

Embodiments will be described hereinafter with reference to the accompanying drawings. In the drawings, constituent elements having like or similar functions are denoted by the same reference numbers and symbols, and their duplicated explanation is omitted.

FIG. 1 is a diagram schematically showing a structure and an equivalent circuit, of a display panel PNL which constitutes a display device of the embodiments. A liquid crystal display device will be explained here as an example of the display device.

More specifically, the liquid crystal display device comprises an active-matrix-type transmissive display panel PNL. The display panel PNL comprises an array substrate AR which is a first substrate, a counter-substrate CT which is a second substrate disposed to be opposed to the array substrate AR, and a liquid crystal layer LQ held in a cell gap between the array substrate AR and the counter-substrate CT. The array substrate AR and the counter-substrate CT are bonded to each other by a sealing member SE. The display panel PNL includes an active area ACT on which an image is displayed, on the inner side surrounded by the sealing member SE. The active area ACT is constituted by a plurality of pixels PX arrayed in a matrix.

The array substrate AR includes, in the active area ACT, gate lines G (G1 to Gn), capacitance lines C (C1 to Cn), source lines S (S1 to Sm), etc. Each of the gate lines G is led out to the outside of the active area ACT and is connected to a gate driver GD. Each of the source lines S is led out to the outside of the active area ACT and is connected to a source driver SD. Each of the capacitance lines C is led out to the outside of the active area ACT and is electrically connected to a voltage applying module VCS to which an auxiliary capacitance voltage is supplied.

Each pixel PX comprises a switching element SW, a liquid crystal capacitance CLC, a storage capacitance CS in parallel with the liquid crystal capacitance CLC, etc. The liquid crystal capacitance CLC is constituted by a pixel electrode PE, a common electrode CE, and a liquid crystal layer LQ. The pixel electrode PE is electrically connected to the switching element SW. The common electrode CE is electrically connected to a power supply module VCOM of a common potential.

The switching element SW is constituted by a thin-film transistor (TFT) and is electrically connected to the gate line G and the source line S. A control signal to control turning on and off the switching element SW is supplied to the gate line G. A video signal is supplied to the source line S. When the switching element SW is turned on based on a control signal supplied to the gate line G, the source line S and the pixel electrode PE are brought into a conductive state. A pixel potential corresponding to the video signal supplied to the source line S is written in the pixel electrode PE. Because of a potential difference between the common electrode CE of the common potential and the pixel electrode PE of the pixel potential, a voltage is applied to the liquid crystal layer LQ and alignment of liquid crystal molecules contained in the liquid crystal layer LQ is controlled.

The storage capacitance CS is configured to hold the voltage applied to the liquid crystal layer LQ for a certain period, and is constituted by a pair of electrodes opposed via an insulating film. For example, the storage capacitance CS is constituted by the a first electrode of the same potential as the pixel electrode PE, a second electrode of the same potential as the capacitance line C, and the insulating film interposed between the first electrode and the second electrode.

Explanation of the detailed structure of the display panel PNL is omitted here but, in a display mode utilizing a longitudinal electric field intersecting a main surface of the substrate, the pixel electrode PE is disposed on the array substrate AR while the common electrode CE is disposed on the counter-substrate CT. In addition, in a display mode utilizing a lateral electric field extending along the main surface of the substrate, both the pixel electrode PE and the common electrode CE are disposed on the array substrate AR.

FIG. 2 is a plan view schematically showing a basic structure of each of the pixels PX on the array substrate AR shown in FIG. 1. The pixel structure of the display panel PNL in the display mode utilizing the lateral electric field as an example of the display mode will be explained here. Main portions necessary for explanations alone are shown in the figure.

Gate lines G1 and G2 extend along a first direction X. Each of the source lines S1 and S2 extends along a second direction Y and intersects gate lines G1 and G2. The switching element SW is located near the intersection portion of the gate line G1 and the source line S1, and is electrically connected with gate line G1 and the source line S1. The switching element SW includes a semiconductor layer SC. The semiconductor layer SC is formed of, for example, polycrystalline silicon.

The example of the switching element SW shown in the figure is in a double-gate structure comprising a first gate electrode WG1 and a second gate electrode WG2. The first gate electrode WG1 and the second gate electrode WG2 are electrically connected to each other and, for example, each of them is a part of gate line G1. The semiconductor layer SC intersects the first gate electrode WG1 and the second gate electrode WG2. One of end sides of the semiconductor layer SC is electrically connected to the source line S1 while the other end side is electrically connected to the pixel electrode PE. In the example illustrated, the source line S1 is in contact with one of end sides of the semiconductor layer SC through a contact hole CH1. A relay electrode RE is located between the other end side of the semiconductor layer SC and the pixel electrode PE. The relay electrode RE is in contact with the other end side of the semiconductor layer SC through a contact hole CH2. The pixel electrode PE is in contact with the relay electrode RE through a contact hole CH3.

A common electrode CE is formed to be opposed to a plurality of pixel electrodes PE. Each of the pixel electrodes PE is disposed above the common electrode CE. Each pixel electrode PE comprises a plurality of slits SL that face the common electrode CE.

Figure 3:
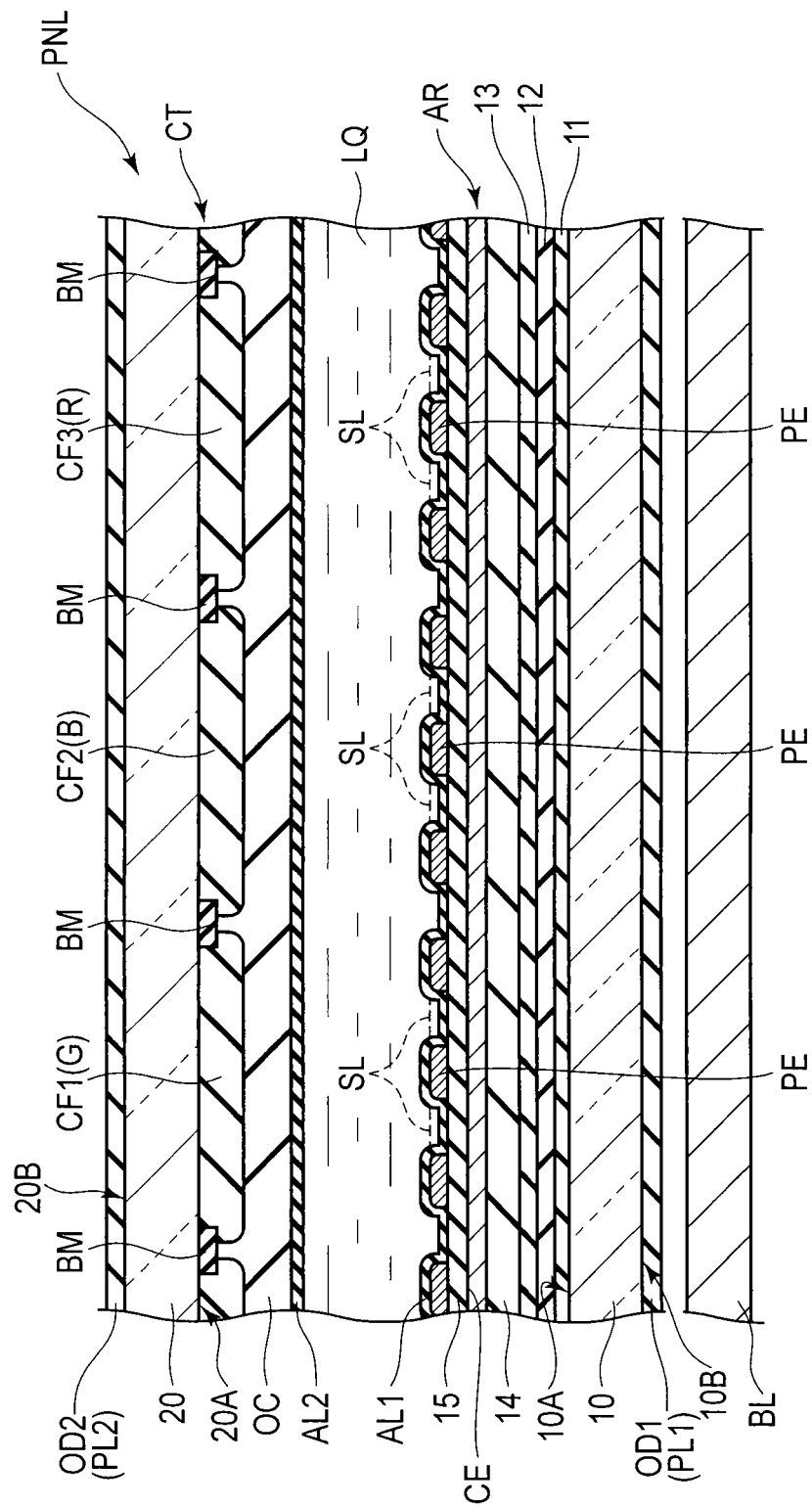
FIG. 3 is a cross-sectional view schematically showing the structure of the display panel PNL comprising the pixels PX shown in FIG. 2.

FIG. 3 is a cross-sectional view schematically showing the structure of the display panel PNL comprising the pixels PX shown in FIG. 2.

The array substrate AR is formed by using a first insulating substrate 10 with light transparency, such as a glass substrate and a resin substrate. The array substrate AR comprises the common electrode CE, the pixel electrodes PE, a first insulating film 11, a second insulating film 12, a third insulating film 13, a fourth insulating film 14, a fifth insulating film 15, a first alignment film AL1, etc., on a side opposed to the counter-substrate CT of the first insulating substrate 10.

The first insulating film 11 is disposed on an inner surface 10A of the first insulating substrate 10, which is opposed to the counter-substrate CT. The second insulating film 12 is disposed on the first insulating film 11. The third insulating film 13 is disposed on the second insulating film 12. The fourth insulating film 14 is disposed on the third insulating film 13. The first insulating film 11, the second insulating film 12, and the third insulating film 13 are formed of an inorganic material such as a silicon nitride and a silicon oxide. The fourth insulating film 14 is formed of an organic material such as an acrylic resin. The semiconductor layer of a switching element (not shown) is located between the first insulating film 11 and the second insulating film 12, the gate lines and the gate electrodes of the switching element are located between the second insulating film 12 and the third insulating film 13, and the source lines and the relay electrode are located between the third insulating film 13 and the fourth insulating film 14.

The common electrode CE is disposed on the fourth insulating film 14. The common electrode CE is formed of a transparent, electrically conductive material such as indium tin oxide (ITO) or indium zinc oxide (IZO). The common electrode CE is covered with the fifth insulating film 15. The fifth insulating film 15 is formed of an inorganic material such as a silicon nitride.

The pixel electrodes PE are disposed on the fifth insulating film 15 to be opposed to the common electrode CE. The slits SL are formed in each pixel electrode PE. The pixel electrodes PE are formed of, for example, a transparent, electrically conductive material such as ITO or IZO. The pixel electrodes PE are covered with the first alignment film AL1. The first alignment film AL1 also covers the fifth insulating film 15. The first alignment film AL1 is formed of a material having a horizontal alignment property and is disposed on a surface of the array substrate AR which is in contact with the liquid crystal layer LQ.

In contrast, the counter-substrate CT is formed by using a second insulating substrate 20 with light transparency, such as a glass substrate and a resin substrate. The counter-substrate CT comprises a black matrix (light-shielding member) BM, color filters CF1 to CF3, an overcoat layer OC, a second alignment film AL2, etc., on a side of the second insulating substrate 20 opposed to the array substrate AR.

The black matrix BM is disposed on an inner surface 20A of the second insulating substrate 20, which is opposed to the array substrate AR. The black matrix BM is formed along pixel boundaries and is located just above wiring portions such as the gate lines, the source lines and the switching elements. The black matrix BM is formed of a black resin material or a light-shielding metal material.

Each of the color filters CF1 to CF3 is disposed on the inner surface 20A of the second insulating substrate 20. For example, the color filter CF1 is formed of a resin material colored in green. The color filter CF2 is formed of a resin material colored in blue. The color filter CF3 is formed of a resin material colored in red.

The overcoat layer OC covers the color filters CF1 to CF3. The overcoat layer OC is formed of a transparent resin material. The overcoat layer OC is covered with the second alignment film AL2. The second alignment film AL2 is formed of a material having a horizontal alignment property and is disposed on a surface of the counter-substrate CT, which is in contact with the liquid crystal layer LQ.

The array substrate AR and the counter-substrate CT as described above are disposed such that the first alignment film AL1 and the second alignment film AL2 face each other. A predetermined cell gap is formed between the array substrate AR and the counter-substrate CT, by a columnar spacer (not shown), etc. The array substrate AR and the counter-substrate CT are adhered to each other by a sealing member SE such that a cell gap is formed. The liquid crystal layer LQ is constituted by a liquid crystal composition containing liquid crystal molecules sealed in a cell gap between the first alignment film AL1 of the array substrate AR and the second alignment film AL2 of the counter-substrate CT.

A backlight unit BL is disposed on a side opposite to a side of the array substrate AR, which is opposed to the counter-substrate CT. Various types of units are applicable as the backlight unit BL, but explanation of the detailed structure of the backlight unit BL is omitted. The backlight unit BL emits light toward the display panel PNL.

A first optical element OD1 including a first polarizer PL1 is disposed on an outer surface 10B of the first insulating substrate 10. A second optical element OD2 including a second polarizer PL2 is disposed on an outer surface 20B of the second insulating substrate 20. A first absorption axis of the first polarizer PL1 and a second absorption axis of the second polarizer PL2 are in, for example, a cross-Nicol relationship in position.

Figure 4:
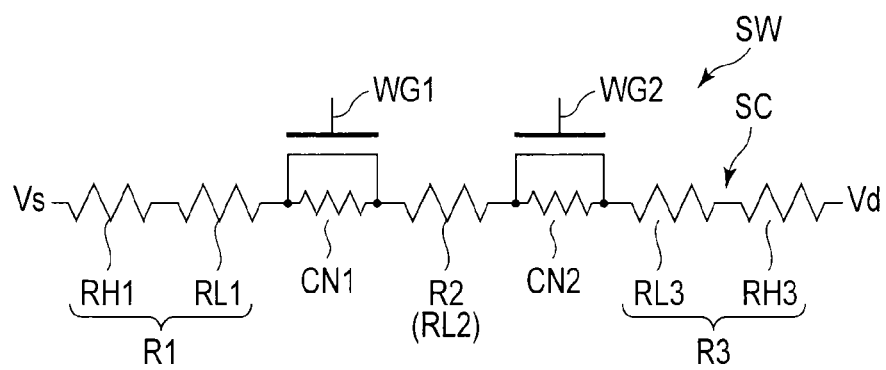
FIG. 4 is an illustration of the equivalent circuit of the switching element SW shown in FIG. 2.

FIG. 4 is an illustration of the equivalent circuit of the switching element SW shown in FIG. 2. The switching element SW to be explained here is formed in a double-gate structure and includes a high concentration area and a low concentration area that are different in impurity concentration of the semiconductor layer. The structure of the switching element SW is not limited to the example illustrated.

In the example illustrated, a potential of a one-end side terminal of the switching element SW which is connected to the source line S1 is represented by Vs while a potential of the other end side terminal of the switching element SW which is connected to the pixel electrode PE is represented by Vd. A state in which Vd is greater than Vs corresponds to a case where charges of a positive field are held by the pixel electrodes PE. In addition, a state in which Vd is smaller than Vs corresponds to a case where charges of a negative field are held by the pixel electrodes PE.

The semiconductor layer SC of the switching element SW includes a first impurity area R1, a second impurity area R2, a third impurity area R3, a first channel area CN1, and a second channel area CN2. The first channel area CN1 is located between the first impurity area R1 and the second impurity area R2. The second channel area CN2 is located between the second impurity area R2 and the third impurity area R3. The first gate electrode WG1 is opposed to the first channel area CN1. The second gate electrode WG2 is opposed to the second channel area CN2.

Each of the first impurity area R1, the second impurity area R2, and the third impurity area R3 corresponds to an area where an impurity is implanted to the semiconductor layer SC. The first impurity area R1 is located at one of end sides (source line side) of the switching element SW. The third impurity area R3 is located at the other end side (pixel electrode side) of the switching element SW.

The first impurity area R1 includes a first high-concentration area RH1 and a first low-concentration area RL1. The third impurity area R3 includes a third high-concentration area RH3 and a third low-concentration area RL3. The entire body of the second impurity area R2 corresponds to a second low-concentration area RL2.

The first low-concentration area RL1 is located between the first high-concentration area RH1 and the first channel area CN1. The second impurity area R2 (the second low-concentration area RL2) is located between the first channel area CN1 and the second channel area CN2. The third low-concentration area RL3 is located between the third high-concentration area RH3 and the second channel area CN2.

It should be noted that, the present inventors assumed that when the semiconductor layer SC is irradiated with light during operation of the switching element SW, an optical leakage current could easily be produced relatively in the impurity area located at the pixel electrode side, as compared with the impurity area located at the source line side.

The present inventors conducted an experiment to confirm occurrence of an optical leakage current at the switching element SW of the double-gate structure. The optical leakage current, which is also called a photoexcitation current, is a current which results from the excitation of electrons by the irradiation of light. In the experiment, the switching element SW for testing corresponding to the equivalent circuit shown in FIG. 3 was formed, the switching element SW was scanned from the source line side to the pixel electrode side while irradiating the switching element SW with laser light from above, and the optical leakage current was measured.

Figure 5:
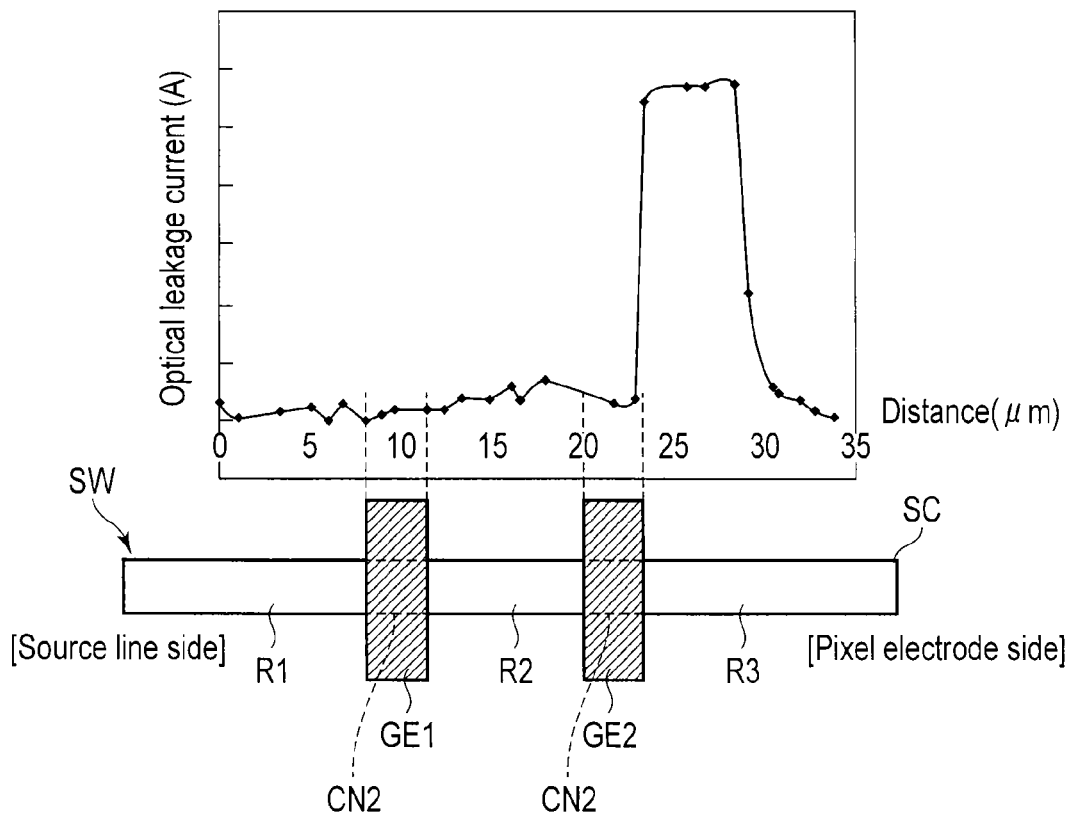
FIG. 5 is an illustration showing the structure of the switching element SW applied to the experiment, and a measurement result of the optical leakage current.

FIG. 5 is an illustration showing the structure of the switching element SW applied to the experiment, and a measurement result of the optical leakage current. In the illustration, a horizontal axis represents a position which is irradiated with the laser light and a vertical axis represents the magnitude of the optical leakage current. However, the magnitude of the optical leakage current is a relative value normalized with reference to a predetermined value.

The illustrated measurement results show a positive value as the optical leakage current at any photo-irradiated position. The measurement results indicate that when the third impurity area R3 is irradiated with the laser light, a greater optical leakage current flows than when the first impurity area R1 and the second impurity area R2 are irradiated with laser light.

In general, alternating-current drive is applied to the liquid crystal display device to prevent what is called burn-in. In other words, the pixel electrode PE alternately holds the charges of the negative field and the charges of the positive field. When the charges of the negative field are held by the pixel electrode PE, the impurity area on the pixel electrode side corresponds to the source area while the impurity area on the source line side corresponds to the drain area. When the charges of the positive field are held by the pixel electrode PE, the impurity area on the pixel electrode side corresponds to the drain area while the impurity area on the source line side corresponds to the source area.

In the negative field, photoexcited electrons produced in the drain area located on the source line side are implanted into the source line, but the potential is hardly varied since the source line is on the side of supplying the potential. In contrast, in the positive field, photoexcited electrons produced in the drain area located on the pixel electrode side are implanted into the pixel electrode which holds the charges of the positive field. For this reason, the pixel potential held in the pixel electrode is lowered. In other words, the optical leakage is more pronounced in the positive field than in the negative field.

Next, a structural example of the switching element SW of the embodiments will be described.

Figure 6:
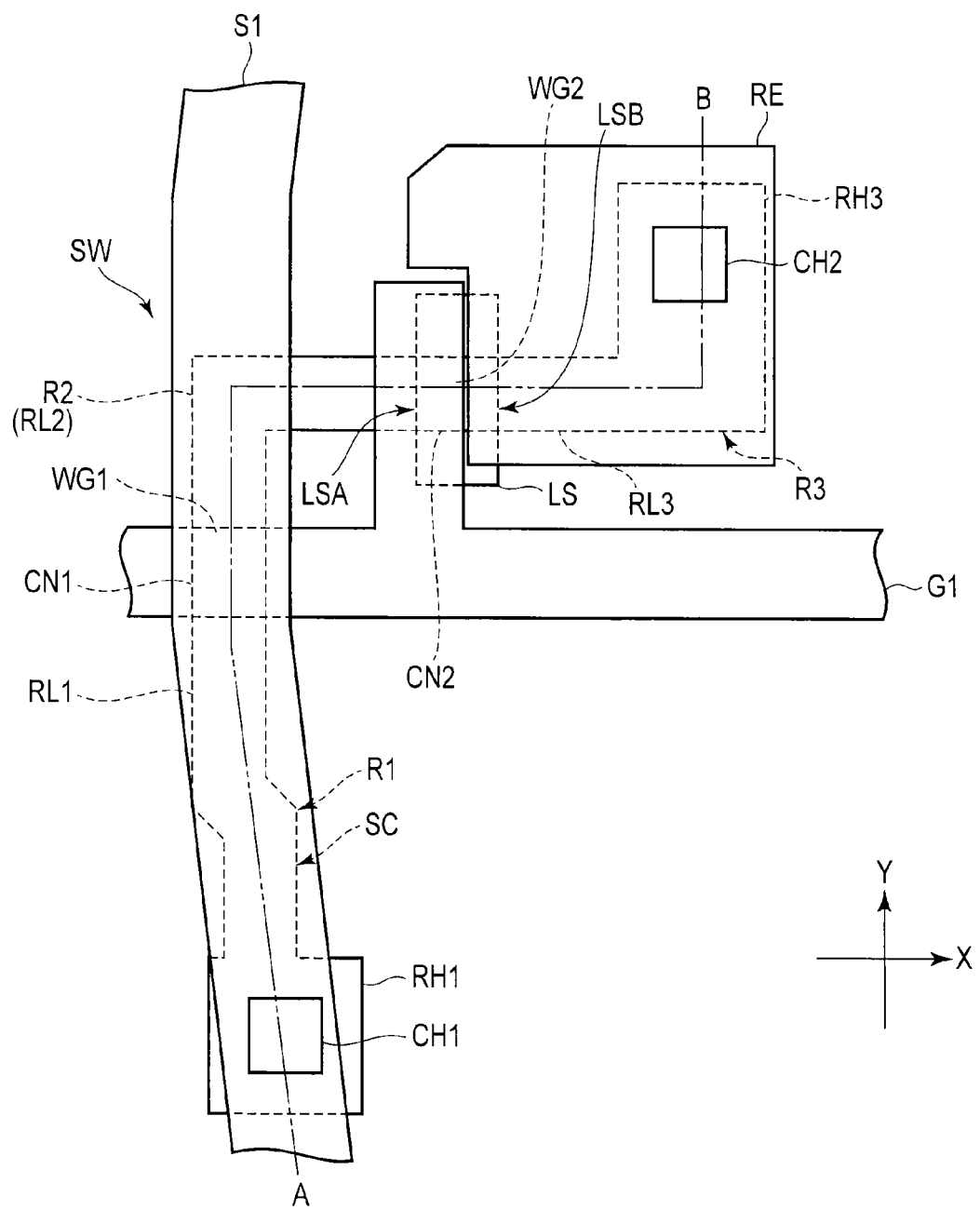
FIG. 6 is a plan view schematically showing a structural example of the switching element SW applicable to the liquid crystal display device of the embodiments.

FIG. 6 is a plan view schematically showing a structural example of the switching element SW applicable to the liquid crystal display device of the embodiments.

In the example illustrated, the semiconductor layer SC is formed in an approximately L-letter shape. The first impurity area R1, the first channel area CN1, the second impurity area R2, the second channel area CN2 and the third impurity area R3 are aligned in this order. A first high-concentration area RH1, a first low-concentration area RL1, the first channel area CN1, and the second impurity area R2 (or a second low-concentration area RL2) are aligned along the second direction Y. The second impurity area R2 is bent at approximately ninety degrees. The second impurity area R2, the second channel area CN2, the third low-concentration area RL3 and the third high-concentration area RH3 are aligned in the first direction X. A portion of the semiconductor layer SC, which extends along the second direction Y (i.e., the first high-concentration area RH1, the first low-concentration area RL1, the first channel area CN1, and a part of the second impurity area R2) is opposed to the source line S1.

In the embodiments, an area of the semiconductor layer SC where the optical leakage is pronounced, is mainly shielded by a light-shielding film LS. In other words, the light-shielding film LS is disposed to be opposed to an area of the semiconductor layer SC where the optical leakage is pronounced, i.e., an area including the boundary between the second channel area CN2 and the third impurity area R3, based on the above-described experiment. In the example illustrated, the light-shielding film LS is extended to spread over the second channel area CN2 and the third impurity area R3, and includes an end portion LSA opposed to the second channel area CN2, and other end portion LSB opposed to the third low-concentration area RL3 of the third impurity area R3. In other words, the light-shielding film LS is opposed to each of the area of the second channel area CN2 on the pixel electrode side and the area of the third impurity area R3 on the side adjacent to the second channel area CN2, in the semiconductor layer SC. In contrast, the light-shielding film LS is not opposed to the first impurity area R1, the first channel area CN1, the second impurity area R2, or the third high-concentration area RH3. In addition, the light-shielding film LS is formed in an insular shape, and is disposed at a position displaced from the position opposed to the source line S1. For this reason, the light-shielding film LS does not form an undesired parasitic capacitance between the light-shielding film and the source line S1 or between the light-shielding film and the area on the source line side of the semiconductor layer SC. Furthermore, the light-shielding film LS is disposed at a position displaced from the position opposed to the portion of gate line G1 extending along the first direction X. For this reason, the light-shielding film LS does not form an undesired parasitic capacitance between the light-shielding film and gate line G1.

The first gate electrode WG1 is opposed to the first channel area CN1. The second gate electrode WG2 is opposed to the second channel area CN2. The relay electrode RE is opposed to the third impurity area R3. The relay electrode RE is formed of the same metal material as the source line S1, etc.

Figure 7:
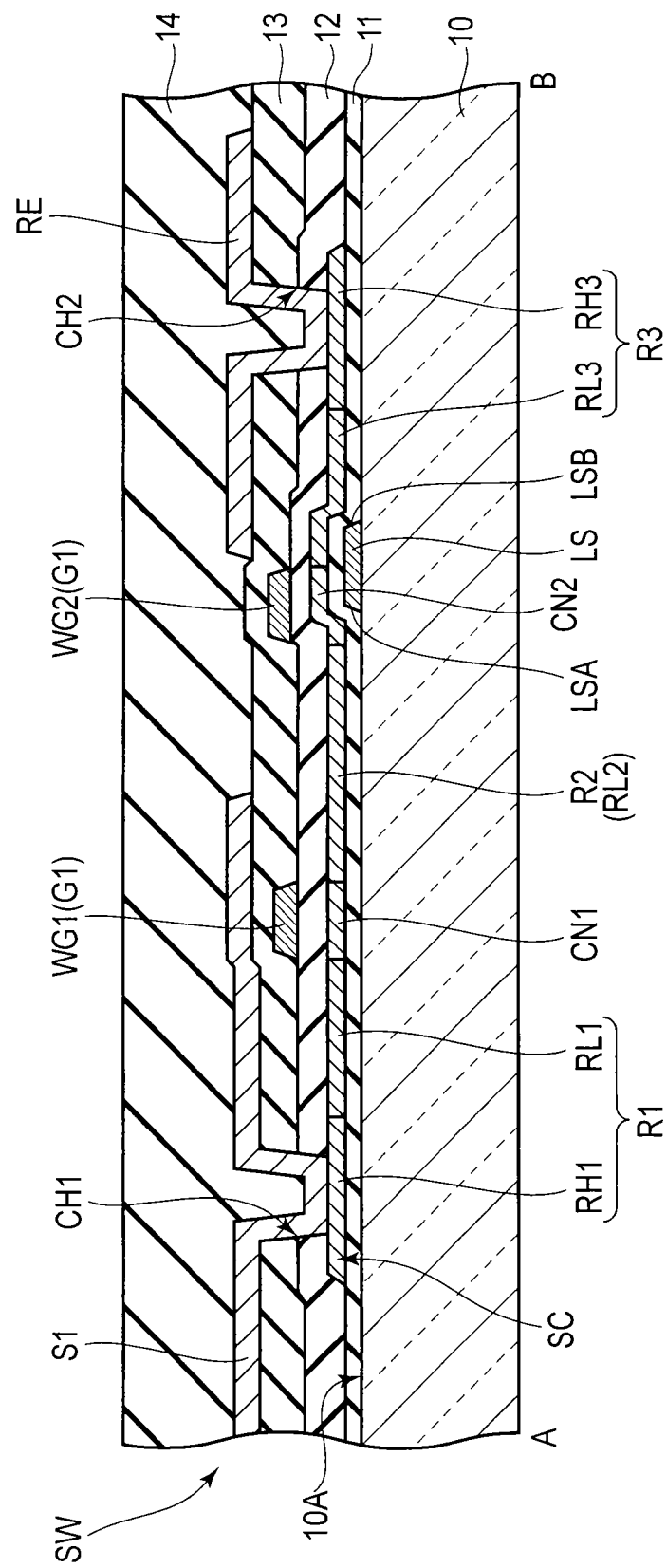
FIG. 7 is a cross-sectional view schematically showing the structure of the switching element SW shown in FIG. 6 as cut along an A-B line.

FIG. 7 is a cross-sectional view schematically showing the structure of the switching element SW shown in FIG. 6 as cut along an A-B line.

The light-shielding film LS is located between the first insulating substrate 10 and the semiconductor layer SC. In the example illustrated, the light-shielding film LS is disposed on the inner surface 10A of the first insulating substrate 10 and is covered with the first insulating film 11. The light-shielding film LS is formed of a metal material such as molybdenum (Mo), tungsten (W), aluminum (Al), titanium (Ti), and silver (Ag).

The semiconductor layer SC is disposed on the first insulating film 11 and is covered with the second insulating film 12. In the semiconductor layer SC, the first high-concentration area RH1, the first low-concentration area RL1, the first channel area CN1, the second impurity area R2, the second channel area CN2, the third low-concentration area RL3 and the third high-concentration area RH3 are aligned in this order, from the one-end side to the other end side of the semiconductor layer. The second channel area CN2 is located directly above the end portion LSA of the light-shielding film LS. The third low-concentration area RL3 is located directly above the other end portion LSB of the light-shielding film LS.

The first gate electrode WG1 and the second gate electrode WG2 are disposed on the second insulating film 12 and covered with the third insulating film 13. The first gate electrode WG1 is located directly above the first channel area CN1. The second gate electrode WG2 is located directly above the second channel area CN2.

The source line S1 and the relay electrode RE are disposed on the third insulating film 13 and are covered with the fourth insulating film 14. The source line S1 is in contact with the first high-concentration area RH1 through the contact hole CH1 which penetrates the second insulating film 12 and the third insulating film 13. The relay electrode RE is in contact with the third high-concentration area RH3 through the contact hole CH2 which penetrates the second insulating film 12 and the third insulating film 13. The relay electrode RE is located directly above the third low-concentration area RL3 and the third high-concentration area RH3.

A pixel electrode not shown in the figure is in contact with the relay electrode RE through a contact hole which penetrates the fourth insulating film 14.

Gate line G1 including the first gate electrode WG1 and the second gate electrode WG2, the source line S1 and the relay electrode RE are formed of a metal material such as molybdenum (Mo), tungsten (W), aluminum (Al), titanium (Ti), and silver (Ag).

According to the embodiments, the semiconductor layer SC of the switching element SW is opposed to the light-shielding film LS disposed on its back surface side (i.e., a side on which the backlight unit BL is disposed). The light-shielding film LS is disposed to be opposed to the area of the semiconductor layer SC where the optical leakage is pronounced, particularly the area including the boundary between the channel area (i.e., the above-described second channel area) and the impurity area (i.e., the above-described third impurity area) located on the pixel electrode side. For this reason, the light emitted from the backlight unit BL and directed to the area of the semiconductor layer SC where the optical leakage can easily occur, is shielded by a light-shielding film LS. The optical leak can be therefore suppressed at the switching element SW. The operation errors at the switching element SW which results from the optical leak and the variation in the pixel potentials held by the pixel electrodes PE can be thereby suppressed.

On the surface side of the semiconductor layer SC, the channel area (i.e., the above-described second channel area) located on the pixel electrode side is shielded from the light by the gate electrode (i.e., the above-described second gate electrode) and the impurity area (i.e., the above-described third impurity area) is shielded from the light by the relay electrode. The optical leakage which results from the light scattering inside the display panel PNL can also be therefore suppressed. In addition, external light incident on the display panel PNL from the outside is blocked by the black matrix located directly above the switching element SW, the optical leakage resulting from the external light can also be suppressed.

In contrast, the light-shielding film LS is not opposed to the area of the semiconductor layer SC where the optical leakage hardly occurs, particularly, the area on the source line side. In particular, the light-shielding film LS is disposed at a position displaced from the position opposed to the source line. For this reason, an area of disposition of the light-shielding film LS can be reduced and parasitic capacitance produced between the light-shielding film and the semiconductor layer can be reduced. In addition, the area on the source line side, of the semiconductor layer SC is not opposed to the light-shielding film LS. For this reason, the capacitive coupling of the light-shielding film LS and the semiconductor layer SC on the source line side can be prevented. The potential of the light-shielding film LS can be thereby stabilized despite the video signal supplied to the source line. For this reason, the potential in the area on the pixel electrode side of the semiconductor layer SC which is capacitively coupled to the light-shielding film LS can be stabilized, and disturbance in the pixel potentials held by the pixel electrodes PE can be suppressed. Preferable display quality can be therefore obtained.

Moreover, reduction of an area contributing to the display can be suppressed by reducing an area of disposition of the light-shielding film LS.

Next, another structural example of the switching element SW will be described.

FIG. 8 is a plan view schematically showing another structural example of the switching element SW applicable to the liquid crystal display device of the embodiments.

The illustrated structural example is different from the structural example shown in FIG. 6 with respect to a feature that the light-shielding film LS is extended along the first direction X. In other words, the light-shielding film LS is extended to spread over the second impurity area R2, the second channel area CN2, and the third impurity area R3. More specifically, the light-shielding film LS is opposed to the entire body of the second channel area CN2, and includes the end portion LSA opposed to the second impurity area R2, and the other end portion LSB opposed to the third impurity area R3 (third low-concentration area RL3). In other words, the light-shielding film LS is opposed to each of the area of the second impurity area R2 on the side adjacent to the second channel area CN2, the second channel area CN2, and the area of the third impurity area R3 on the side adjacent to the second channel area CN2, in the semiconductor layer SC. In contrast, the light-shielding film LS is not opposed to the first impurity area R1, the first channel area CN1, or the third high-concentration area RH3. In addition, the light-shielding film LS is disposed at a position displaced from the position opposed to the source line S1 and the position opposed to the portion of gate line G1 extending along the first direction X.

In the structural example, too, the same advantages as those of the above-described structural example can be obtained. In addition, steps which result from the light-shielding film LS can be eased and breaking of the thin film can be suppressed directly under the second channel area CN2 or the second gate electrode WG2.

In the light-shielding film LS, a distance A along the first direction X from a boundary BR1 between the second impurity area R2 and the second channel area CN2 to the end portion LSA is shorter than a distance B along the first direction X from a boundary BR2 between the second channel area CN2 and the third impurity area R3 to the other end portion LSB. In other words, the distance A may be set to be equal to or shorter than approximately 1 μm to permit an error in processing accuracy between the previously formed light-shielding film LS and the subsequently formed semiconductor layer SC. In contrast, the distance B should desirably be set to be approximately 4 μm since the distance B needs to be a length for assuredly shielding the area where the optical leakage is pronounced as explained above, besides the error in processing accuracy of the light-shielding film LS and the semiconductor layer SC. Thus, the optical leakage at the semiconductor layer SC can be suppressed and the steps at the light-shielding film LS can be eased.

FIG. 9 is a plan view schematically showing another structural example of the switching element SW applicable to the liquid crystal display device of the embodiments.

The illustrated structural example is different from the structural example shown in FIG. 8 with respect to a feature that the light-shielding film LS is further extended along the first direction X and the second direction Y. In other words, the light-shielding film LS is extended to spread over the second impurity area R2, the second channel area CN2, and the third impurity area R3. More specifically, the light-shielding film LS is opposed to the entire body of the second channel area CN2, and includes the end portion LSA opposed to the second impurity area R2, and the other end portion LSB opposed to the third impurity area R3 (third low-concentration area RL3). In addition, the light-shielding film LS is extended up to an area opposed to a part of gate line G1 and a part of the relay electrode RE. In contrast, the light-shielding film LS is not opposed to the first impurity area R1, the first channel area CN1, or the third high-concentration area RH3. In addition, the light-shielding film LS is disposed at a position displaced from the position opposed to the source line S1.

In the structural example, too, the same advantages as those of the above-described structural example can be obtained. In addition, a comparatively great parasitic capacitance is formed between gate line G1 and the light-shielding film LS. For this reason, even if the gate line is charged in a process of manufacturing the array substrate AR, particularly, a process after formation of the gate lines, etc., the charge can be absorbed by the parasitic capacitance formed at the switching element and electrostatic breakdown of the switching element, etc., can be suppressed. It should be noted that an area of disposition of the light-shielding film LS can be extended within a range of being opposed to the black matrix BM.

Next, variation of the embodiments will be explained.

FIG. 10 is a cross-sectional view schematically showing a positional relationship between the light-shielding film LS and the semiconductor layer SC in the switching element SW of the double-gate structure. It should be noted that the first insulating film is interposed between the light-shielding film LS and the semiconductor layer SC, and the second insulating film is interposed between the semiconductor layer SC, and the first gate electrode WG1 and the second gate electrode WG2, but the films are not shown in the figure.

In the switching element SW shown in (A) of the figure, the semiconductor layer SC includes the first impurity area R1, the first channel area CN1 opposed to the first gate electrode WG1, the second impurity area R2, the second channel area CN2 opposed to the second gate electrode WG2, and the third impurity area R3. Each of the first impurity area R1, the second impurity area R2, and the third impurity area R3 corresponds to a high-concentration area containing an impurity of a comparatively high concentration. The first impurity area R1 is electrically connected to the source line while the third impurity area R3 is electrically connected to the pixel electrode. In the switching element SW, the light-shielding film LS is opposed to spread over at least the second channel area CN2 and the third impurity area R3 of the semiconductor layer SC. The light-shielding film LS may be extended as represented by a broken line in the figure. In other words, the end portion LSA of the light-shielding film LS may be located directly under the second channel area CN2 or the second impurity area R2. The other end portion LSB of the light-shielding film LS is located directly under the third impurity area R3.

The switching element SW shown in (B) of the figure is different from the switching element shown in (A) with respect to features that the first impurity area R1 includes the first high-concentration area RH1 and the first low-concentration area RL1 and that the third impurity area R3 includes the third low-concentration area RL3 and the third high-concentration area RH3. In other words, the semiconductor layer SC includes the first high-concentration area RH1 (first impurity area R1), the first low-concentration area RL1 (first impurity area R1), the first channel area CN1, the second low-concentration area RL2 (second impurity area R2), the second channel area CN2, the third low-concentration area RL3 (third impurity area R3), and the third high-concentration area RH3 (third impurity area R3). The first channel area CN1 is opposed to the first gate electrode WG1, and the second channel area CN2 is opposed to the second gate electrode WG2. The first low-concentration area RL1, the second low-concentration area RL2, and the third low-concentration area RL3 contain the impurity of the same concentration, and correspond to areas of a lower impurity concentration than the concentration of the first high-concentration area RH1 and the third high-concentration area RH3. The first high-concentration area RH1 is electrically connected to the source line while the third high-concentration area RH3 is electrically connected to the pixel electrode. In the switching element SW, the light-shielding film LS is opposed to spread over at least the second channel area CN2 and the third low-concentration area RL3 of the semiconductor layer SC. The light-shielding film LS may be extended as represented by a broken line in the figure, and the end portion LSA of the light-shielding film LS may be located directly under the second channel area CN2 or the second low-concentration area RL2. The other end portion LSB of the light-shielding film LS may be located directly under the third low-concentration area RL3 or the third high-concentration area RH3.

The switching element SW shown in (C) of the figure is different from the switching element shown in (B) with respect to features that the second impurity area R2 includes the second high-concentration area RH2 and the second low-concentration area RL2 and that the second high-concentration area RH2 is located in the middle of the second impurity area R2. In other words, the semiconductor layer SC includes the first high-concentration area RH1 (first impurity area R1), the first low-concentration area RL1 (first impurity area R1), the first channel area CN1, the second low-concentration area RL2 (second impurity area R2), the second high-concentration area RH2 (second impurity area R2), the second low-concentration area RL2 (second impurity area R2), the second channel area CN2, the third low-concentration area RL3 (third impurity area R3), and the third high-concentration area RH3 (third impurity area R3). In the switching element SW, the light-shielding film LS is opposed to spread over at least the second channel area CN2 and the third low-concentration area RL3 of the semiconductor layer SC. The light-shielding film LS may be extended as represented by a broken line in the figure, and the end portion LSA of the light-shielding film LS may be located directly under any one of the second channel area CN2, the second low-concentration area RL2, and the second high-concentration area RH2. The other end portion LSB of the light-shielding film LS may be located directly under the third low-concentration area RL3 or the third high-concentration area RH3.

The switching element SW shown in (D) of the figure is different from the switching element shown in (A) with respect to features that the first channel area CN1 is further extended from the position opposed to the first gate electrode WG1 to each of the first impurity area R1 side and the second impurity area R2 side and that the second channel area CN2 is further extended from the position opposed to the second gate electrode WG2 to each of the second impurity area R2 side and the third impurity area R3 side. In the switching element SW, the light-shielding film LS is opposed to spread over at least the second channel area CN2 and the third impurity area R3 of the semiconductor layer SC. The light-shielding film LS may be extended as represented by a broken line in the figure, and the end portion LSA of the light-shielding film LS may be located directly under the second channel area CN2 or the second impurity area R2. In addition, the other end portion LSB of the light-shielding film LS is located directly under the third impurity area R3.

The example of the switching element of the double-gate structure has been explained in the embodiments, but the embodiments can be applied to a switching element of a single-gate structure. In other words, the area where the optical leakage is pronounced is the area including the boundary between the channel area and the impurity area located on the pixel electrode side as the present inventors reviewed. Therefore, in the switching element of the single-gate structure, too, the same advantages as those explained in the embodiments can be obtained by shielding the area from the light by the light-shielding film LS and applying a structure in which the area located on the source line side of the semiconductor layer is not opposed to the light-shielding film LS.

Figure 11:
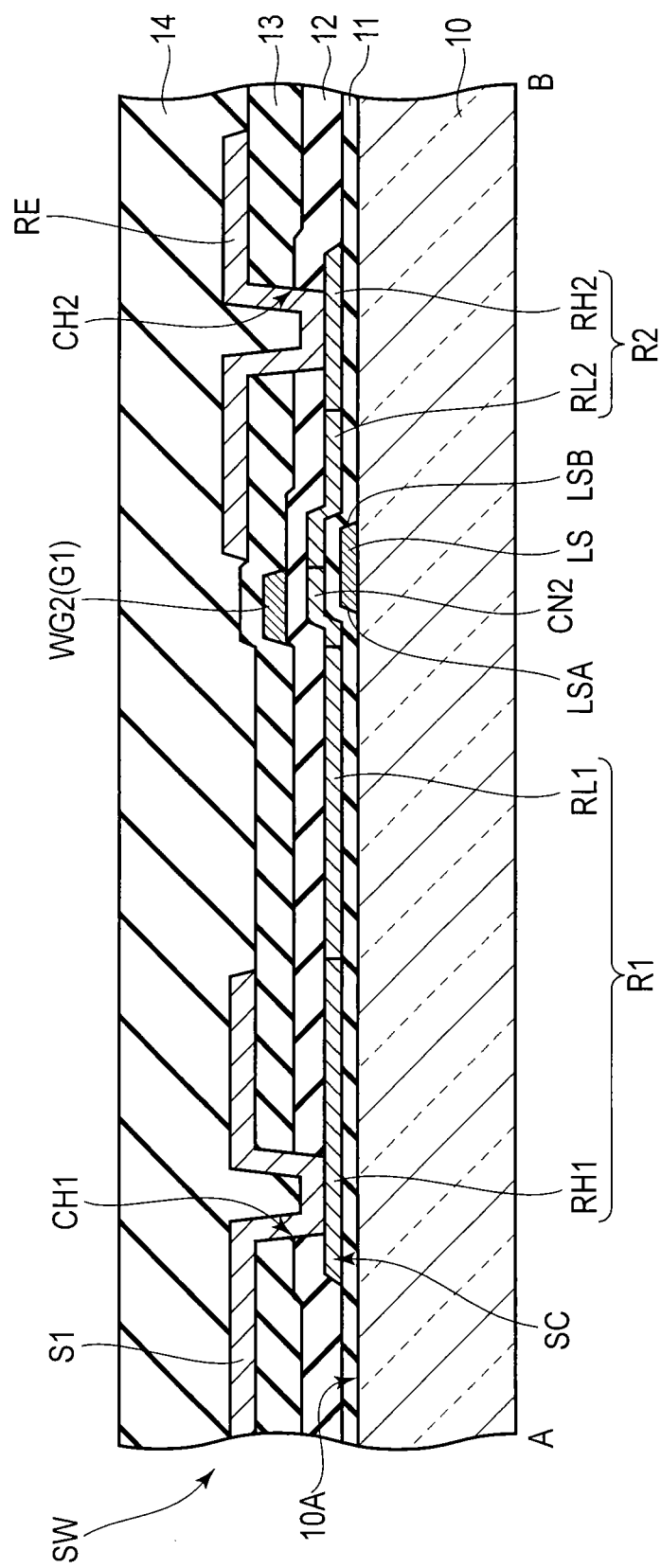
FIG. 11 is a cross-sectional view schematically showing the switching element SW of a single-gate structure.

FIG. 11 is a cross-sectional view schematically showing the switching element SW of the single-gate structure. The switching element SW shown in the figure can be applied to the array substrate AR shown in FIG. 3.

The switching element SW shown in FIG. 11 is different from the switching element SW shown in FIG. 7 with respect to features that the semiconductor layer SC includes one channel area and that the switching element SW includes one gate electrode WG. The other elements are the same as those of the switching element SW shown in FIG. 7 and are denoted by the same reference numbers and symbols, and their explanation is omitted.

The light-shielding film LS is located between the first insulating substrate 10 and the semiconductor layer SC. In the example illustrated, the light-shielding film LS is disposed on the inner surface 10A of the first insulating substrate 10 and is covered with the first insulating film 11. The semiconductor layer SC is disposed on the first insulating film 11 and is covered with the second insulating film 12. In the semiconductor layer SC, the first impurity area R1, the channel area CN, and the second impurity area R2 are aligned in this order, from an end side to the other end side of the semiconductor layer SC. In the example illustrated, the first impurity area R1 includes the first high-concentration area RH1 and the first low-concentration area RL1. The first low-concentration area RL1 is located between the first high-concentration area RH1 and the channel area CN. In addition, the second impurity area R2 includes the second low-concentration area RL2 and the second high-concentration area RH2. The second low-concentration area RL2 is located between the channel area CN and the second high-concentration area RH2.

The gate electrode WG is disposed on the second insulating film 12 and is covered with the third insulating film 13. The gate electrode WG is opposed to the channel area CN. The source line S1 and the relay electrode RE are disposed on the third insulating film 13 and are covered with the fourth insulating film 14. The source line S1 is in contact with the first high-concentration area RH1 through the contact hole CH1 which penetrates the second insulating film 12 and the third insulating film 13. The relay electrode RE is in contact with the second high-concentration area RH2 through the contact hole CH2 which penetrates the second insulating film 12 and the third insulating film 13. The relay electrode RE is electrically connected with the pixel electrode PE as shown in FIG. 2, and has the same potential as the pixel electrode PE.

The light-shielding film LS is disposed at a position displaced from the position opposed to the source line S1, and is opposed to an area including a boundary between the channel area CN and the second impurity area R2. The light-shielding film LS includes the end portion LSA opposed to the channel area CN, and the other end portion LSB opposed to the second impurity area R2. In the example illustrated, the other end portion LSB of the light-shielding film LS is opposed to the second low-concentration area RL2, but may be opposed to the second high-concentration area RH2.

Variation of the switching element SW of the single-gate structure will be hereinafter explained.

Figure 12:
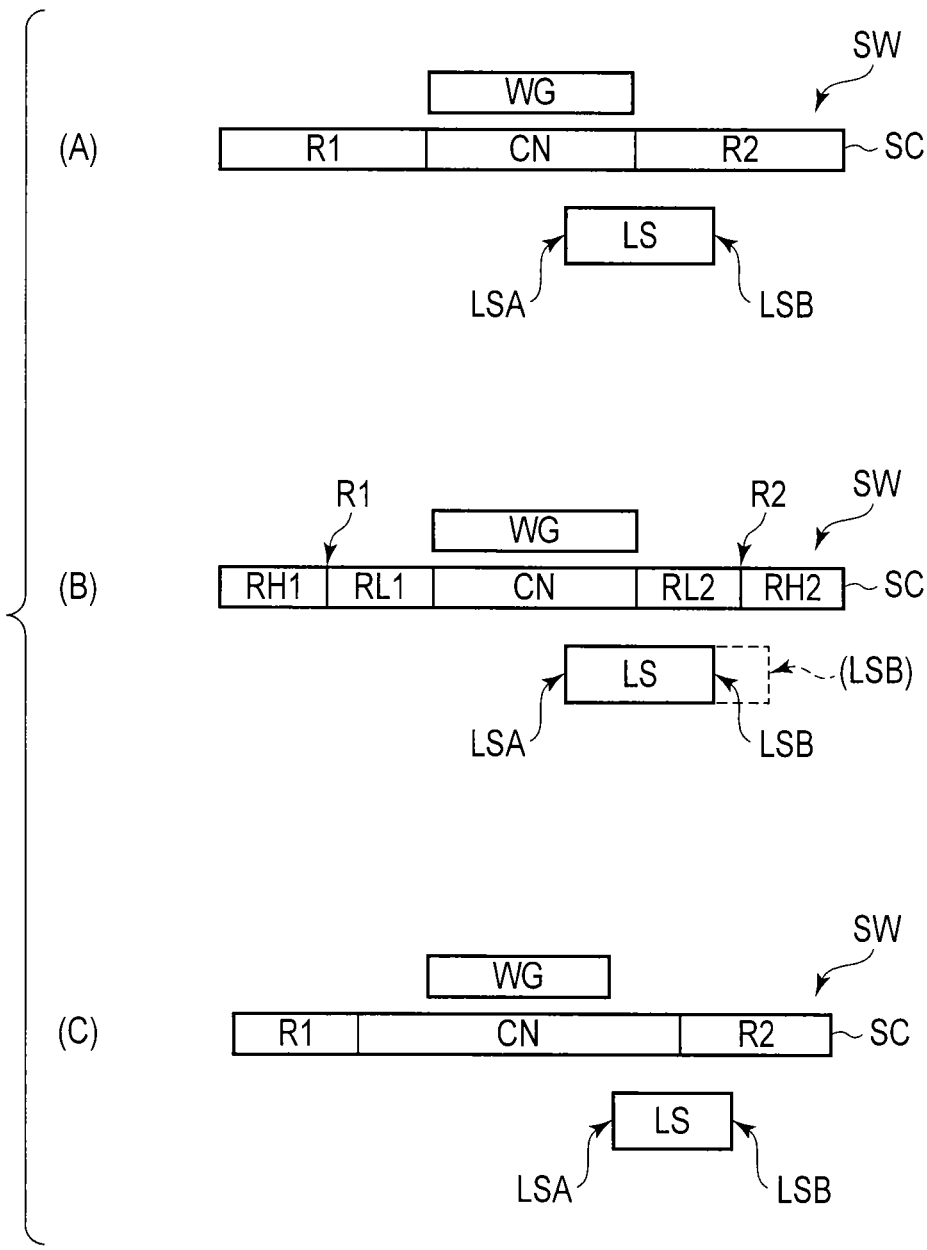
FIG. 12 is a cross-sectional view illustrating a positional relationship between a light-shielding film LS and a semiconductor layer SC in the switching element SW of the single-gate structure.

FIG. 12 is a cross-sectional view illustrating a positional relationship between the light-shielding film LS and the semiconductor layer SC in the switching element SW of the single-gate structure. It should be noted that the first insulating film is interposed between the light-shielding film LS and the semiconductor layer SC, and the second insulating film is interposed between the semiconductor layer SC and the gate electrode WG, but the films are not shown in the figure.

In the switching element SW shown in (A) of the figure, the semiconductor layer SC includes the first impurity area R1, the channel area CN opposed to the gate electrode WG, and the second impurity area R2. Each of the first impurity area R1 and the second impurity area R2 corresponds to a high-concentration area containing an impurity of a comparatively high concentration. The first impurity area R1 is electrically connected to the source line while the second impurity area R2 is electrically connected to the pixel electrode. In the switching element SW, the light-shielding film LS is opposed to spread over the channel area CN and the second impurity area R2 of the semiconductor layer SC. The end portion LSA of the light-shielding film LS is located directly under the channel area CN, and the other end portion LSB of the light-shielding film LS is located directly under the second impurity area R2.

The switching element SW shown in (B) of the figure is different from the switching element shown in (A) with respect to features that the first impurity area R1 includes the first high-concentration area RH1 and the first low-concentration area RL1 and that the second impurity area R2 includes the second low-concentration area RL2 and the second high-concentration area RH2. In other words, the semiconductor layer SC includes the first high-concentration area RH1 (first impurity area R1), the first low-concentration area RL1 (first impurity area R1), the channel area CN opposed to the gate electrode WG, the second low-concentration area RL2 (second impurity area R2), and the second high-concentration area RH2 (second impurity area R2). The first low-concentration area RL1 and the second low-concentration area RL2 contain the impurity of the same concentration, and correspond to areas of a lower impurity concentration than the concentration of the first high-concentration area RH1 and the second high-concentration area RH2. The first high-concentration area RH1 is electrically connected to the source line while the second high-concentration area RH2 is electrically connected to the pixel electrode, as explained above. In the switching element SW, the light-shielding film LS is opposed to spread over at least the channel area CN and the second low-concentration area RL2 of the semiconductor layer SC. The end portion LSA of the light-shielding film LS is located directly under the channel area CN. In addition, the light-shielding film LS may be extended as represented by a broken line in the figure, and the other end portion LSB of the light-shielding film LS may be located directly under the second low-concentration area RL2 or the second high-concentration area RH2.

The switching element SW shown in (C) of the figure is different from the switching element shown in (A) with respect to a feature that the channel area CN is further extended from the position opposed to the gate electrode WG to each of the first impurity area R1 side and the second impurity area R2 side. In the switching element SW, the light-shielding film LS is opposed to spread over the channel area CN and the second impurity area R2 of the semiconductor layer SC. The end portion LSA of the light-shielding film LS is located directly under the channel area CN, and the other end portion LSB of the light-shielding film LS is located directly under the second impurity area R2.

The liquid crystal display device has been explained as the example of the display device in the above embodiments, but the embodiments can be applied to the other display devices such as an organic EL display device. It is assumed that in the organic EL display device, light emitted from a self-luminous element propagates inside the display panel and the semiconductor layer SC of the switching element SW is irradiated with the light. In the organic EL display device, too, the light directed to the front surface side and the rear surface side of the area of the semiconductor layer SC where the optical leakage can easily occur, is shielded by applying the structure explained in the embodiments. Therefore, the same advantage as that explained above can be obtained.

According to the embodiments, as described above, the display device of preferable display quality can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
an insulating substrate;
a light-shielding film formed on the insulating substrate;
a first insulating film which covers the light-shielding film;
a semiconductor layer formed on the first insulating film, formed of polycrystalline silicon, and including a first impurity area, a second impurity area, and a channel area located between the first impurity area and the second impurity area;
a second insulating film which covers the semiconductor layer;
a gate electrode formed on the second insulating film and opposed to the channel area;
a source line electrically connected to the first impurity area; and
an electrode electrically connected to the second impurity area;
wherein the first impurity area, the channel area and the second impurity area are integrally connected,
the light-shielding film is disposed at a position displaced from a position opposed to the source line, and opposed to an area including a boundary between the channel area and the second impurity area, and
the light-shielding film includes an end portion opposed to the channel area and the other end portion opposed to the second impurity area.

2. The device of claim 1, further comprising:
a first substrate comprising the insulating substrate, the light-shielding film, the first insulating film, the semiconductor layer, the second insulating film, the gate electrode, the source line and the electrode;
a second substrate opposed to the first substrate; and
a common electrode opposed to the electrode.

3. The device of claim 2, further comprising:
a liquid crystal layer held between the first substrate and the second substrate.

4. The device of claim 2, further comprising:
a backlight unit disposed on a side opposite to a side of the first substrate which is opposed to the second substrate,
wherein the light-shielding film shields the boundary between the channel area and the second impurity area from light emitted from the back light unit.

5. A display device comprising:
an insulating substrate;
a light-shielding film formed on the insulating substrate;
a first insulating film which covers the light-shielding film;
a semiconductor layer formed on the first insulating film, formed of polycrystalline silicon, and including a first impurity area, a second impurity area, a third impurity area, a first channel area located between the first impurity area and the second impurity area, and a second channel area located between the second impurity area and the third impurity area;
a second insulating film which covers the semiconductor layer;
a first gate electrode formed on the second insulating film and opposed to the first channel area;
a second gate electrode formed on the second insulating film, electrically connected to the first gate electrode, and opposed to the second channel area;
a source line electrically connected to the first impurity area; and
an electrode electrically connected to the third impurity area;
wherein the first impurity area, the first channel area, the second impurity area, the second channel area and the third impurity area are integrally connected,
the light-shielding film is disposed at a position displaced from a position opposed to the source line, and opposed to an area including a boundary between the second channel area and the third impurity area, and
the light-shielding film includes an end portion opposed to one of the second channel area and the second impurity area, and the other end portion opposed to the third impurity area.

6. The device of claim 5, wherein
in the light-shielding film including the end portion opposed to the second impurity area and the other end portion opposed to the third impurity area, a distance from a boundary between the second impurity area and the second channel area to the end portion is shorter than a distance from a boundary between the second channel area and the third impurity area to the other end portion.

7. The device of claim 5, further comprising:
a first substrate comprising the insulating substrate, the light-shielding film, the first insulating film, the semiconductor layer, the second insulating film, the first gate electrode, the second gate electrode, the source line and the electrode;
a second substrate opposed to the first substrate; and
a common electrode opposed to the electrode.

8. The device of claim 7, further comprising:
a liquid crystal layer held between the first substrate and the second substrate.

9. The device of claim 7, further comprising:
a backlight unit disposed on a side opposite to a side of the first substrate which is opposed to the second substrate,
wherein the light-shielding film shields the boundary between the second channel area and the third impurity area from light emitted from the back light unit.

10. A display device comprising:
an insulating substrate including a first surface and a second surface opposed to the first surface;
a semiconductor layer located above the first surface, formed of polycrystalline silicon, and including a first impurity area, a second impurity area, and a channel area located between the first impurity area and the second impurity area;
an insulating film which covers the semiconductor layer;
a gate electrode formed on the insulating film and opposed to the channel area;
a source line electrically connected to the first impurity area;
an electrode electrically connected to the second impurity area;
a backlight unit emitting light toward the second surface; and
a light-shielding film located between the first surface and the semiconductor layer,
wherein in planar view, the light-shielding film is disposed at a position displaced from a position opposed to the source line, and overlaps an area including a boundary between the channel area and the second impurity area.

* * * * *